United States Patent [19]

Hibi et al.

[11] Patent Number: 5,786,273
[45] Date of Patent: Jul. 28, 1998

[54] SEMICONDUCTOR DEVICE AND ASSOCIATED FABRICATION METHOD

[75] Inventors: Toshitaka Hibi, Kyoto; Takatoshi Yasui, Osaka; Hisashi Ogawa, Osaka; Susumu Akamatsu, Osaka; Shunsuke Kugo, Osaka, all of Japan

[73] Assignee: Matsushita Electric Industrial Co., Ltd., Osaka, Japan

[21] Appl. No.: 602,575

[22] Filed: Feb. 14, 1996

[30] Foreign Application Priority Data

Feb. 15, 1995 [JP] Japan ................... 7-027084

[51] Int. Cl.⁶ ........................... H01L 21/44
[52] U.S. Cl. ................... 438/637; 438/638; 438/647; 438/666; 438/672
[58] Field of Search ................... 437/195, 191, 437/60; 257/758, 211; 438/637, 638, 647, 666, 672

[56] References Cited

U.S. PATENT DOCUMENTS

| | | |
|---|---|---|
| 3,880,675 | 4/1975 | Tarui et al. |
| 4,990,467 | 2/1991 | Lee et al. |
| 5,380,679 | 1/1995 | Kano. |
| 5,554,864 | 9/1996 | Koyama .................. 257/211 |
| 5,576,243 | 11/1996 | Wuu et al. ................ 437/195 |
| 5,610,101 | 3/1997 | Koyama .................. 437/195 |

*Primary Examiner*—Caridad Everhart
*Attorney, Agent, or Firm*—McDermott, Will & Emery

[57] ABSTRACT

Formed in a second interlayer dielectric are a first contact hole and a second contact hole. The first and second contact holes each extend to a first-level interconnect line. Tungsten is formed on the entirety of a substrate to form a first plug, a second plug, and a tungsten layer. A silicon oxide layer is formed. Thereafter, a patterning process is carried out to form a second-level interconnect line which is connected with the first plug and a top protective layer, and the top of the second plug remains exposed. A sidewall is formed on the side surfaces of the second-level interconnect line and the top protective layer. Subsequently, a third-level interconnect line, which is connected with the exposed second plug, is formed. Such arrangement not only reduces the number of contact hole formation masks, it also cuts down the number of fabrication steps. Further, the aspect ratio of the second contact hole becomes lower thereby achieving highly reliable semiconductor devices.

7 Claims, 8 Drawing Sheets

Fig.8(b) PRESENT INVENTION

SEMICONDUCTOR DEVICE AND ASSOCIATED FABRICATION METHOD

BACKGROUND OF THE INVENTION

This invention pertains to a semiconductor device having multilevel interconnect lines and to its fabrication method. The present invention is directed particularly to simplifications of the steps of providing connections between impurity-diffused regions of a semiconductor substrate and interconnect layers and to simplifications of the steps of providing connections between upper and lower interconnect layers, and to improvements in the semiconductor device reliability.

As the function of semiconductor devices is expanded, and as the number of components per chip grows, interconnect structures for applying signals to active components (e.g., transistors) and passive components (e.g., resistors) of a semiconductor device become more and more complicated. To cope with such expansion and increase, multilevel interconnect techniques have been employed. In fabricating a semiconductor device having a typical multilevel interconnect structure, its components are first formed on a semiconductor substrate and thereafter individual interconnect lines are formed one after another with an insulating layer laying between each interconnect line. In such a case, in order to establish a connection either between an interconnect layer and a component or between each interconnect layer, a connection hole (e.g., a contact hole or a via hole) is first formed in an insulating layer. Metallic material, which is either the same type of material as forming its overlying interconnect line or a different type of material, is deposited in the connection hole to form a plug and, at the same time, an interconnect line or an electrode to be connected with the plug is formed. An example of the fabrication of a MOS transistor formed in the memory region of a dynamic RAM is described to demonstrate a conventional contact region formation method with reference to FIGS. 6(a)–(h).

Figure 6A:
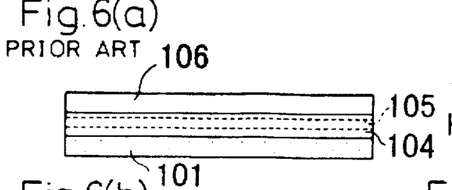
FIGS. 6(a)–(h) depict cross sectional views at different steps of the fabrication of a semiconductor device in accordance with a prior art technique.

FIG. 6(a) shows a fabrication step in which a word line 105 is formed on a silicon substrate 101. Note that a single word line 105 extends over great numbers of active regions and isolators for isolation between components and acts in an active region as a gate electrode above a gate insulating layer. Each gate electrode is covered with a respective top protective layer and has at its side surface a sidewall and an isolator/insulating layer. In FIG. 6(a), all of these insulating layers are shown as silicon oxide layers 104. Although not shown in FIG. 6(a), MOS transistors are formed, each MOS transistor being made up of a gate electrode and impurity-diffused regions (i.e., source/drain regions formed in the silicon substrate). A first interlayer dielectric 106, which is a CVD silicon oxide layer, is formed on the silicon oxide layer 104.

Figures 6B, 6C, 6D, 6F, 6G, 6H:
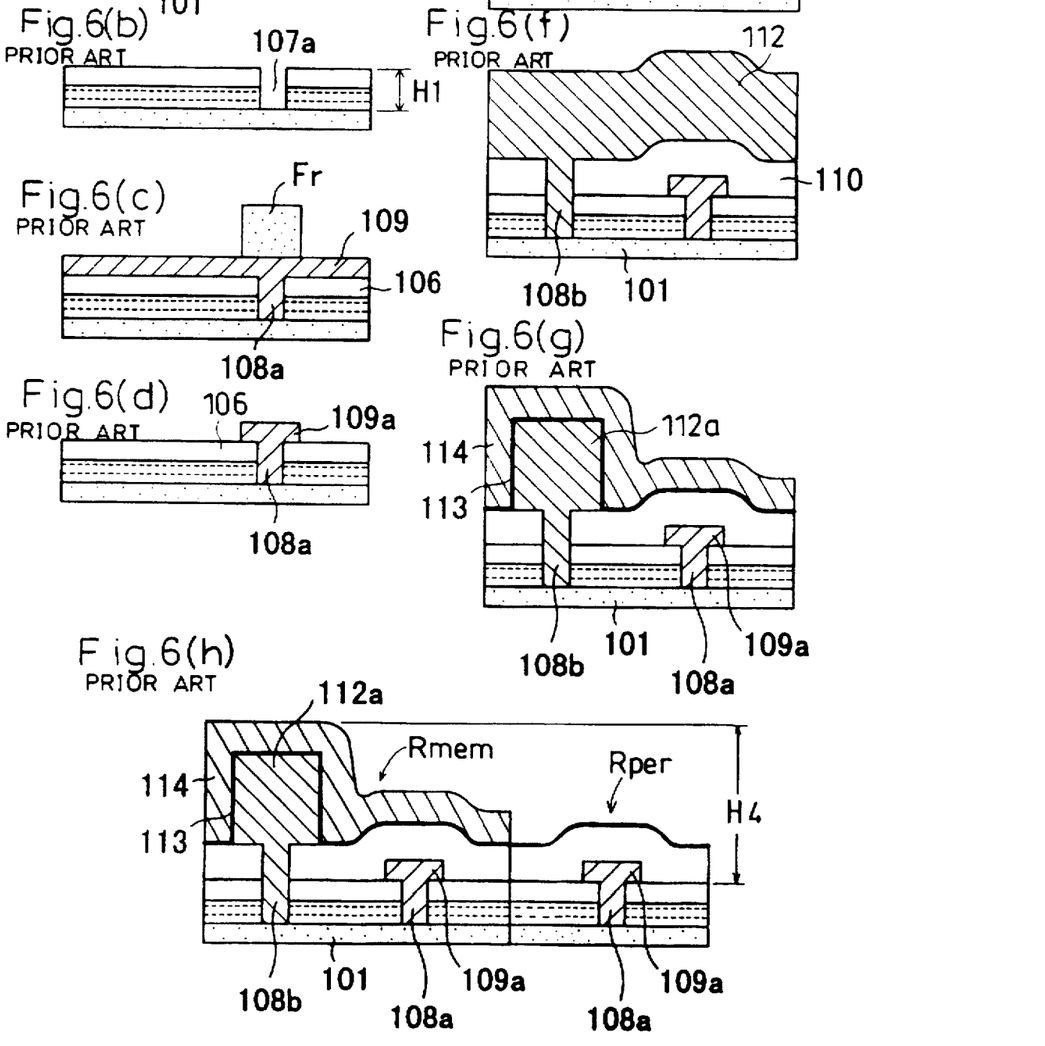

In a fabrication step as shown in FIG. 6(b), a first contact hole 107a is formed in portions of the first interlayer dielectric 106 and the silicon oxide layer 104 by means of a photoetching technique in such a way that the first contact hole 107a extends down to an impurity-diffused region in the silicon substrate 101.

In a fabrication step as shown in FIG. 6(c), tungsten is deposited on the entire surface of the silicon substrate 101. A first plug 108a is formed in the first contact hole 107a and, at the same time, a tungsten layer 109 is formed on the first interlayer dielectric 106. A photoresist mask Fr is formed on the tungsten layer 109.

In a fabrication step as shown in FIG. 6(d), the tungsten layer 109 is patterned by means of a photoetching technique using the photoresist mask Fr, to form a bit line 109a that is connected with the first plug 108a.

Figure 6E:
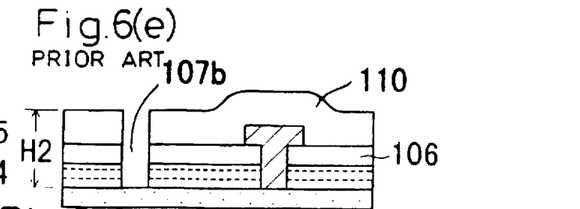

In a fabrication step as shown in FIG. 6(e), a second interlayer dielectric 110, which is a silicon oxide layer, is formed on the first interlayer dielectric 106 and the bit line 109a, and a second contact hole 107b is formed in the second interlayer dielectric 110 in such a way as to extend down to an impurity-diffused region of the silicon substrate 101.

In a fabrication step as shown in FIG. 6(f), tungsten silicide is deposited in the second contact hole 107b and on the second interlayer dielectric 110. In this way, a second plug 108b is formed in the second contact hole 107b and a tungsten silicide layer 112 is formed on the second interlayer dielectric 110.

In a fabrication step as shown in FIG. 6(g), the tungsten silicide layer 112 is patterned to form a charge-storage electrode 112a that is connected with the second plug 108b. Thereafter, a capacity insulator 113, which is formed of a silicon nitride layer and a silicon oxide layer, is formed. A plate electrode 114, which is formed of an n-type impurity-containing polysilicon layer, is formed.

FIG. 6(h) shows not only the structure of a memory cell region Rmem but also the structure of a peripheral circuit region Rper in the fabrication step of FIG. 6(g).

The subsequent fabrication steps are not described, but after the fabrication step of FIG. 6(h) an upper-level interconnect line or the like is formed over, for example, a third interlayer dielectric.

Figure 7:
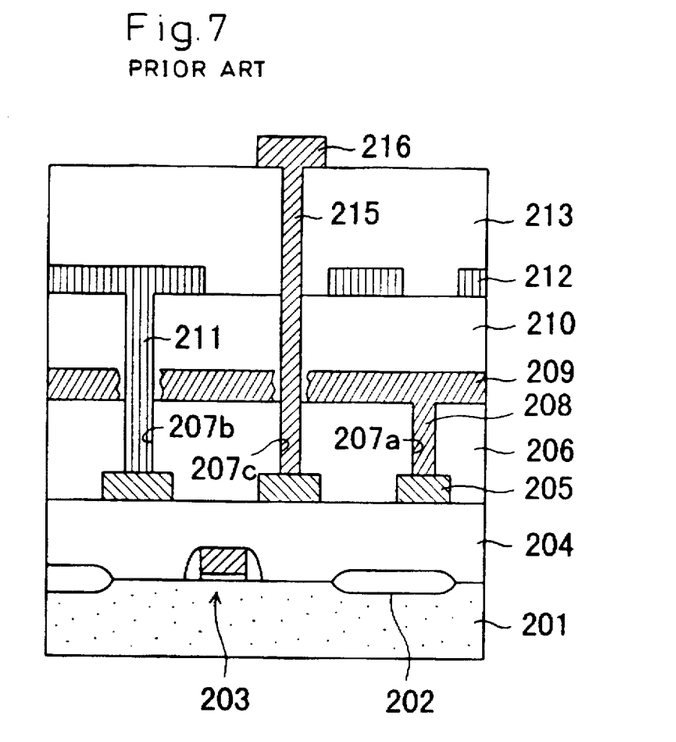
FIG. 7 shows in cross section the structure of the memory cell section of a conventional dynamic RAM.

FIG. 7 is a cross sectional view of a semiconductor device having a conventional multilevel interconnect structure. A MOS transistor 203 and other components are formed in an active region of a silicon substrate 201 enclosed by a component insulator 202. Formed on the silicon substrate 201 is a first interlayer dielectric 204 having a thickness of between about 400 nm and about 500 nm. A first-level interconnect line 205 is formed on the first interlayer dielectric 204. A second, a third, and a fourth interlayer dielectric 206, 210, and 213 are formed in that order on the first interlayer dielectric 204 and on the first-level interconnect line 205. A second-, a third-, and a fourth-level interconnect line 209, 212, and 216 are formed on the interlayer dielectrics 206, 210, and 213, respectively. The second-level interconnect line 209 and the first-level interconnect line 205 are electrically connected together by the first plug 208 formed by depositing a conductive material in the first contact hole 207a which passes through the second interlayer dielectric 206. The third-level interconnect line 212 and the first-level interconnect line 205 are electrically connected together by the second plug 211 formed by depositing a conductive material in the second contact hole 207b which passes through the second interlayer dielectric 206 and the third interlayer dielectric 210. The fourth-level interconnect line 216 and the first-level interconnect line 205 are electrically connected together by the third plug 215 formed by depositing a conductive material in the third contact hole 207c which passes through the third interlayer dielectric 210 and the fourth interlayer dielectric 213. It is to be noted that although in FIG. 7 the first to third contact holes 207a–207c are illustrated as if they are at the same cross section they are actually formed at respective cross sections.

A way of forming each interlayer dielectric 206, 210, 213 is described. A TEOS is deposited about 500 nm by means of a plasma-CVD technique. This TEOS is etched back 100 nm by an Ar spatter technique. A TEOS is further deposited about 1600 nm. A resist is deposited about 800 nm. Inverted patterns of lower interconnect lines are formed by means of photolithography techniques. A resist is further deposited 1500 nm. Both the resist and the TEOS are etched back to such an extent that the TEOS has a thickness of about 800 nm. The interlayer dielectrics are planarized, in other words the final thickness of the interlayer dielectrics is about 800 nm.

The above-described fabrication method, however, has the following drawbacks.

The first drawback is that the contact hole 207a, which passes through the interlayer dielectric 206 only, has a relatively shallow depth of about 800 nm. On the other hand, for the case of the second contact hole 207b, it passes through two layers, that is, the interlayer dielectrics 206 and 210. As a result, the depth of the second contact hole 207b may exceed 1600 nm or more and, when taking into account the thickness of interconnect layers, the depth may exceed 2 μm. Further, the third contact hole 207c passes through the three interlayer dielectrics 206, 210, and 213, which makes the depth of this contact hole 207c exceed 2400 nm or more. The fact that the scale of integration of the semiconductor device has recently become larger and larger, the contact hole diameter must be reduced to catch up with such technology advance. If the diameter of contact holes becomes about 0.5–0.6 μm, then the second contact hole 207b and the third contact hole 207c each inevitably come to have a great aspect ratio of above 3. As a result, at the time of the plug formation, the foregoing interconnect material deposition may end in failure due to, for example, the so-called shadowing effect, voids are generated, the resistivity of the contact regions is increased, and connection failure occurs, therefore deteriorating semiconductor device reliability.

Figure 8A:
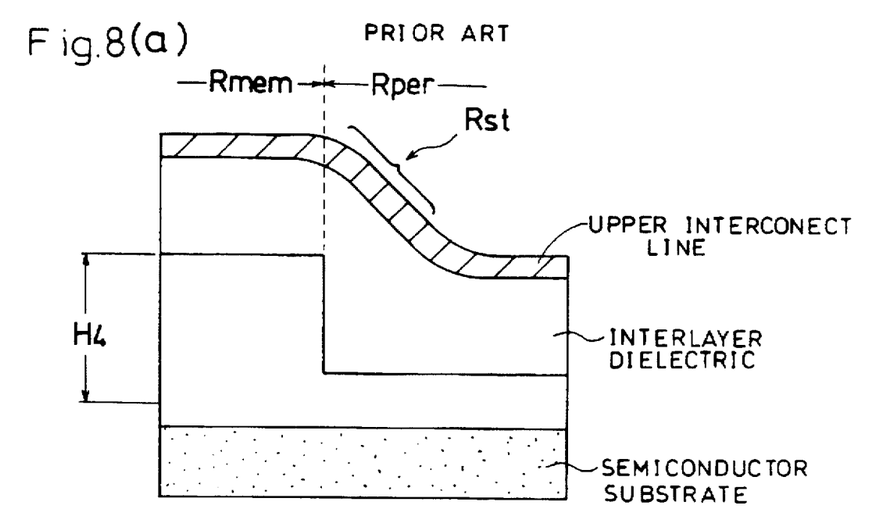
FIGS. 8(a)–(b) show the difference in probability that upper interconnect lines cut off due to the absolute surface level difference between a conventional dynamic RAM and a dynamic RAM of the present invention.

The second drawback is that, since H4 (i.e., the difference in surface level between the top of the plate electrode 114 formed in the fabrication step of FIG. 6(g) and the bottom of the bit line 109a) is great, the accuracy of patterning of upper interconnect lines at later steps becomes low and disconnection occurs. As shown in FIG. 8(a), when H4 is great, a surface level difference region Rst between the memory cell region Rmem and the peripheral circuit region Rper has a steep. As a result, upper interconnect lines are likely to cut off and poor reliability results.

When trying to reduce the height of the charge-storage electrode 112a, it is necessary to increase the area of the charge-storage electrode 112a. This is a bar to increasing the scale of semiconductor device integration. There are constraints by the shape of the charge-storage electrode 112a, as a result of which dynamic RAM memory cells must be designed with limited latitude.

SUMMARY OF THE INVENTION

Bearing in mind the above-described drawbacks with the prior art techniques, the present invention was made. An object of this invention is therefore to provide an improved, reliable semiconductor device and its fabrication method. More specifically, this invention discloses a technique capable of reducing, when forming a connection hole for connecting an interconnect layer and a semiconductor substrate, when forming a connection hole for connecting interconnect layers, or even when forming a connection hole for connecting interconnect layers placed a great distance apart, the aspect ratio of any of these connection holes as low as possible.

Another object of the present invention is to provide an improved semiconductor device and its fabrication method with great design latitude. More specifically, the present invention discloses a technique capable of reducing the difference in surface level between a bit line and a charge-storage electrode in the memory cell region of a dynamic RAM.

The present invention provides a method of fabricating a semiconductor device on a substrate of semiconductor material. This method comprises:

(1) a first step of forming on the semiconductor substrate a first lower conductive portion and a second lower conductive portion;

(2) a second step of forming a first insulating layer to cover the first and second lower conductive portions;

(3) a third step of forming a first connection hole and a second connection hole in the first insulating layer, wherein the first connection hole extends down to the first lower conductive portion and wherein the second connection hole extends down to the second lower conductive portion;

(4) a fourth step of depositing a conductive material in the first and second connection holes to form a first buried layer and a second buried layer, respectively;

(5) a fifth step of:

(5-1) forming a first conducting layer to cover the first buried layer, the second buried layer, and the first insulating layer, and forming a second insulating layer to cover the first conducting layer;

(5-2) patterning the first conducting layer and the second insulating layer to form a first upper conductive portion and a top protective layer, wherein the first upper conductive portion belongs to an interconnect layer located above each of the lower conductive portions and is connected with the first buried layer;

(5-3) exposing the top of the second buried layer;

(6) a sixth step of forming a sidewall on the side surfaces of the first upper conductive portion and the top protective layer;

(7) a seventh step of:

(7-1) forming a second conducting layer to cover the first insulating layer, the sidewall, the top protective layer, and the second buried layer;

(7-2) patterning the second conducting layer to form a second upper conductive portion, wherein the second upper conductive portion belongs to an interconnect layer located above the first upper conductive portion and is connected with the second buried layer.

As described above, the present invention is characterized in that the first connection hole for establishing a connection between the first upper conductive portion and the first lower conductive portion and the second connection hole for establishing a connection between the second upper conductive portion and the second lower conductive portion, are simultaneously formed in the same insulating layer, i.e., the first insulating layer. This is different from a conventional technique in accordance with which the second connection hole is formed after the first insulating layer is covered with another insulating layer. As a result of such arrangement made in the present invention, in other words because of simultaneous formation of the first and second connection holes, the number of connection hole formation masks can be reduced, the number of fabrication steps can be reduced, and the costs of production can be cut down, in relation to a conventional method in which individual connection holes must be formed for different interconnect layers. Further, in the present invention, the second connection hole and the first connection hole are formed in the same insulating layer (i.e., the first insulating layer). This makes it possible, even when the aspect ratio of the second connection hole is to be reduced for achieving a larger scale of integration, to reduce the aspect ratio of the second hole to a greater extent in comparison with a technique in which the second connection hole is formed such that it passes through the first insulating layer and another insulating layer. Such reduction of the aspect ratio improves the state of conductive material deposition in forming a second buried layer. As a result, electrical connection failure likely to occur in the second buried layer can be prevented. The sidewall is operable to isolate/insulate the first and second upper conductive portions in a self-alignment fashion, so that short-circuiting can be prevented. The present invention is able to fabricate highly reliable semiconductor devices with a multilevel interconnect structure.

It is preferred that both the first lower conductive portion and the second lower conductive portion are formed in an interconnect layer which is connected with the semiconductor substrate.

It is preferred that both the first lower conductive portion and the second lower conductive portion are formed in an interconnect line layer that is electrically isolated from the semiconductor substrate.

It is preferred that a first impurity-diffused region and a second impurity-diffused region formed in the semiconductor substrate act as the first lower conductive and as the second lower conductive portion, respectively.

It is preferred that (a) the first step includes forming a third impurity-diffused region in the semiconductor substrate; (b) the third step includes forming in the first insulating layer a third connection hole that extends down to the third impurity-diffused region simultaneously with the first and second connection holes; (c) the fourth step includes depositing the conductive material in the third connection hole to form a third buried layer; and (d) either one of the fifth step and the seventh step includes forming an intermediate conductive portion that is connected to the third buried layer; and that the method further comprises:

an eighth step of forming an interlayer dielectric over the entire surface of the semiconductor substrate;

a ninth step of planarizing the interlayer dielectric;

a tenth step of forming in the interlayer dielectric a fourth connection hole which extends down to the intermediate conductive portion;

an eleventh step of depositing a conductive material in the fourth connection hole to form a fourth buried layer;

a twelfth step of:

forming a third conducting layer to cover the fourth buried layer and the interlayer dielectric;

patterning the third conducting layer to form a third upper conductive portion, wherein the third upper conductive portion belongs to an interconnect layer located above the second upper conductive portion and is connected with the fourth buried layer.

The connection hole, which establishes connection between the third upper conductive portion that belongs to the uppermost interconnect layer and the third lower conductive portion, is division-formed, in other words it comprises two parts, i.e., the third connection hole and the fourth connection hole. This can hold the aspect ratio of each of the third and fourth connection holes low, therefore facilitating the fabrication of semiconductor devices having multilevel (three or more levels) interconnect lines.

It is preferred that (a) the first step includes forming a third impurity-diffused region in the semiconductor substrate; (b) the third step includes forming in the first insulating layer a third connection hole which extends down to the third impurity-diffused region simultaneously with the first and second connection holes; (c) the fourth step includes depositing the conductive material in the third connection hole to form a third buried layer; (d) the fifth step includes exposing the top of the third buried layer; and (e) the seventh step includes:

forming a third insulating layer on the second conducting layer;

patterning the second conducting layer and the third insulating layer at the same time, and exposing the top of the third buried layer; and that the method further comprises:

an eighth step of forming a second sidewall on the side surfaces of the second upper conductive portion and the third insulating layer;

a ninth step of:

forming a third conducting layer to cover the first insulating layer, the third buried layer, the third insulating layer, and the second sidewall;

patterning the third conducting layer to form a third upper conductive portion, wherein the third upper conductive portion belongs to an interconnect layer located above the second upper conductive portion and is connected with the third buried layer.

As a result of such arrangement, the first to third connection holes, which establish connections between the first to third upper conductive portions belonging to interconnect layers of different levels and the first to third lower conductive portions, are simultaneously formed having the same depth. The operation of the present semiconductor fabrication method becomes more significant.

It is preferred that the third step is performed such that each of the first and second connection holes is formed having a diameter of 0.6 μm or less and an aspect ratio of 3 or less.

The present invention provides a method of fabricating on a substrate of semiconductor material a semiconductor device acting as a dynamic RAM. This method comprises:

(1) a first step of forming in the semiconductor substrate within the memory cell region of the dynamic RAM a transistor composed of a gate electrode, a first impurity-diffused region and a second impurity-diffused region;

(2) a second step of forming a first insulating layer to cover the semiconductor substrate and the gate electrode;

(3) a third step of forming in the insulating layer a first connection hole and a second connection hole;

the first connection hole extending down to the first impurity-diffused region;

the second connection hole extending down to the second impurity-diffused region;

(4) a fourth step of depositing a conductive material in the first and second connection holes to form a first buried layer and a second buried layer, respectively;

(5) a fifth step of:

(5-1) forming a first conducting layer to cover the insulating layer and the first and second burled layers, and forming a second insulating layer to cover the first conducting layer;

(5-2) patterning the first conducting layer and the second insulating layer to form a bit line and a bit line top protective layer, and exposing the top of the second buried layer, wherein the bit line is connected with the first buried layer;

(6) a sixth step of forming a sidewall at the side surfaces of the bit line and the top protective layer;

(7) a seventh step of:

(7-1) forming a second conducting layer to cover the first insulating layer, the sidewall, the top protective layer, and the second buried layer;

(7-2) patterning the second conducting layer to form a charge-storage electrode which is connected to the second buried layer;

(8) an eighth step of:

(8-1) forming a second insulating layer to cover the charge-storage electrode, the first insulating layer, the sidewall, and the top protective layer, and forming a third conducting layer to cover the second insulating layer;

(8-2) patterning the second insulating layer and the third conducting layer to form a capacity insulator and a plate electrode.

As a result of such arrangement, the second connection hole for establishing connection between the charge-storage electrode and the impurity-diffused region is formed at the same time as the first connection hole for establishing connection between the bit line and the other impurity-diffused region is formed. This reduces the number of connection hole formation masks, the number of fabrication steps, and the costs of production. Further, since the bottom of the charge-storage electrode and the bottom of the bit line are positioned the same height, this prevents the level difference over the entire substrate from greatly increasing even if the height dimension of the charge-storage electrode increases. The vertical and lateral dimensions of charge-storage electrodes can be designed with greater latitude.

It is preferred that (a) the first step includes forming a third impurity-diffused region in the peripheral circuit region of the dynamic RAM; (b) the third step includes forming in the interlayer dielectric a third connection hole which extends down to the third impurity-diffused region simultaneously with the first and second connection holes; (c) the fourth step includes depositing the conductive material in the third connection hole to form a third buried layer; and (d) the fifth step includes forming a bit line which is connected with the third buried layer, and a bit line top protective layer.

As a result of such arrangement, the slope of a surface level difference region between the memory cell region and the peripheral circuit region of a dynamic RAM becomes less steep, thereby reducing the probability that disconnection occurs in the uppermost interconnect lines, and improving reliability.

It is preferred that the third step is performed such that each of the first and second connection holes is formed having a diameter of 0.6 μm or less and an aspect ratio of 3 or less.

The present invention provides a semiconductor device acting as a dynamic RAM. This semiconductor device comprises:

(a) a semiconductor substrate;

(b) a first lower conductive portion and a second lower conductive portion each of which is formed on the semiconductor substrate;

(c) a first insulating layer which is formed to cover the first lower conductive portion and the second lower conductive portion;

(d) a first connection hole and a second connection hole which are formed in the first insulating layer;

the first connection hole extending down to the first lower conductive portion;

the second connection hole extending down to the second lower conductive portion;

(e) a first buried layer and a second buried layer;

the first and second buried layers being formed by depositing a conductive material in the first and second connection holes;

(f) a first upper conductive portion which belongs to an interconnect layer located above each of the lower conductive portions and which is connected with the first buried layer;

(g) a top protective layer which is formed on the first upper conductive portion and which is composed of an insulating material;

(h) a sidewall which is formed at the side surfaces of the first upper conductive portion and the top protective layer;

(i) a second upper conductive portion which belongs to an interconnect layer located above the first upper conductive portion and which is in contact with the top of the second buried layer.

As a result of such arrangement, the depth of the second connection hole becomes equal to the depth of the first connection hole. This enables the second connection hole to have a lower aspect ratio in relation to the conventional multilevel interconnect structure. This provides improvements in the semiconductor device reliability.

It is preferred that (a) the first and second lower conductive portions are impurity-diffused regions located on both sides of the gate of a transistor formed within the memory cell region of the dynamic RAM; (b) the first upper conductive portion is a bit line of the dynamic RAM; and (c) the second upper conductive portion is a charge-storage electrode of the dynamic RAM.

Since the bottom of the charge-storage electrode and the bottom of the bit line are positioned the same height, this prevents the level difference over the entire substrate from greatly increasing even if the height dimension of the charge-storage electrode increases. The vertical and lateral dimensions of charge-storage electrodes can be designed with greater latitude.

It is preferred that the first and second connection holes each have a diameter of 0.6 μm or less and an aspect ratio of 3 or less.

DETAILED DESCRIPTION OF THE INVENTION

Preferred embodiments of this invention are now detailed by making reference to the accompanying drawing figures.

EMBODIMENT I

The first embodiment is described with reference to FIGS. 1(a)–(g).

Figure 1A:
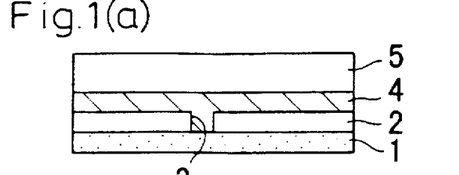
FIGS. 1(a)–(g) depict cross sectional views at different steps of the fabrication of a semiconductor device in accordance with a first embodiment of the present invention.

FIG. 1(a) shows a fabrication step in which a substrate 1 of single crystal silicon-is provided. Formed on the silicon substrate 1 is a first interlayer dielectric 2 which is a silicon oxide layer. A contact hole 3 is formed in the first interlayer dielectric 2, extending down to an impurity-diffused region (not shown) of the silicon substrate 1. Additionally, a first-level interconnect line 4 of tungsten is formed. The contact hole 3 provides electrical continuity between the first-level interconnect line 4 and the silicon substrate 1. Note that in the present embodiment the first-level interconnect line 4 is made up of a first and a second lower conductive portion. These lower conductive portions are placed above the silicon substrate 1 and are formed of the same layer. A second interlayer dielectric 5, which is a silicon oxide layer having a thickness of about 800 nm, is formed on the first-level interconnect line 4 by means of, for example, techniques used to fabricate a conventional semiconductor device (see FIG. 7).

Figure 1B:
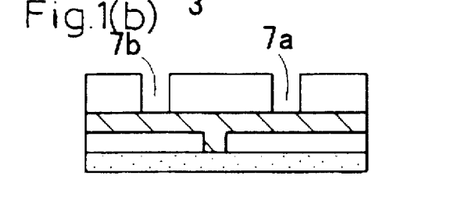

FIG. 1(b) shows a fabrication step in which the second interlayer dielectric 5 is subjected to a photoetching process using a single photoresist mask, to simultaneously form a first contact hole 7a and a second contact hole 7b. Whereas the first contact hole 7a is for connection between the first-level wiring and the second-level wiring, the second contact hole 7b is for connection between the first-level wiring and the third-level wiring.

Figure 1C:
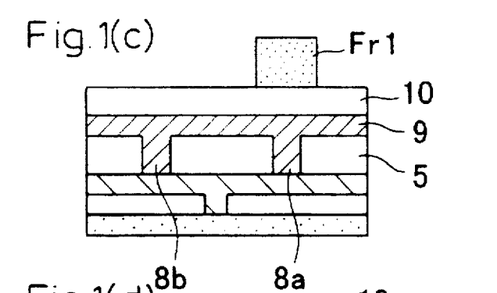

FIG. 1(c) shows a fabrication step in which a CVD (chemical vapor deposition) technique is used to deposit tungsten all over the silicon substrate 1. As a result of such deposition, the first contact hole 7a and the second contact hole 7b are filled with tungsten, whereupon a first plug 8a and a second plug 8b are formed and, at the same time, a layer 9 of tungsten acting as a first conducting layer is formed on the first plug 8a, on the second plug 8b, and on the second interlayer dielectric 5. This is followed by formation of a silicon oxide layer 10 on the tungsten layer 9. Subsequently, a photoresist mask Fr1 is formed on the silicon oxide layer 10 in such a position thereof as to mask the first plug 8a and its neighboring areas.

Figure 1D:
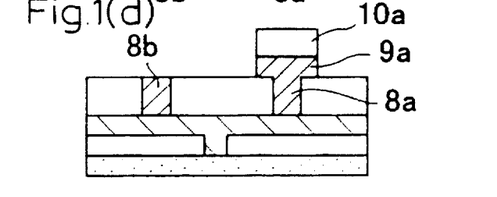

FIG. 1(d) shows a fabrication step in which the photoresist mask Fr1 is used to pattern the silicon oxide layer 10 and the tungsten layer 9, to form a second-level interconnect line 9a and its top protective layer 10a. The second-level interconnect line 9a is a first upper conductive portion that is connected with the first plug 8a. The top of the second plug 8b is exposed while on the other hand the top of the second plug 8a remains unexposed.

Figure 1E:
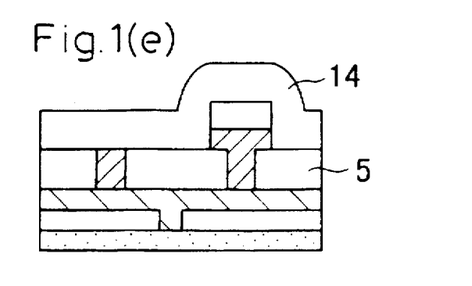

FIG. 1(e) shows a fabrication step in which a CVD technique is used to deposit on the entirety of the silicon substrate 1 a silicon oxide layer 14 for sidewall formation.

Figure 1F:
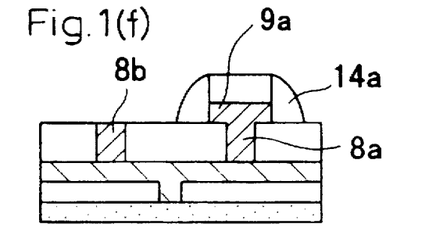

FIG. 1(f) shows a fabrication step in which anisotropic etching is carried out to etch back the silicon oxide layer 14 to re-expose the top of the second plug 8b and a sidewall 14a is formed to cover both the side surface of the second-level interconnect line 9a and the side surface of the top protective layer 10a.

Figure 1G:
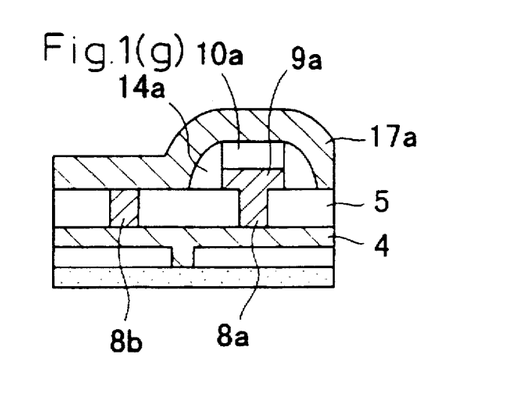

FIG. 1(g) shows a fabrication step in which a layer of tungsten acting as a second conducting layer is deposited all over the silicon substrate 1 by means of a CVD technique. A third-level interconnect line 17a is formed by means of a photoetching technique. This third-level interconnect line 17a is a second upper conductive portion which is connected with the second plug 8b.

The subsequent fabrication step and other fabrication steps are not described here in detail. The following may be performed. A silicon oxide layer is formed on the third-level interconnect line 17a. Further upper-level interlayer dielectrics and interconnect lines are formed by means of the interlayer dielectric deposition and planarization techniques used to fabricate the FIG. 7 semiconductor device. Such processing may be applied to the following preferred embodiments of the present invention.

In the FIG. 1(c) fabrication step, the following may be carried out. The first and second plugs 8a and 8b are first formed by depositing tungsten in the first and second contact holes 7a and 7b and thereafter the tungsten layer 9 is applied thereonto by means of, for example, a spattering technique.

FIG. 1(g) diagrams a semiconductor device fabricated in accordance with the present embodiment. The first and second lower conductive portions are formed of a single layer (i.e., the first-level interconnect line 4). The first upper conductive portion is formed of the second-level interconnect line 9a. The second upper conductive portion is formed of the third-level interconnect line 17a. Whereas the second-level interconnect line 9a and the first-level interconnect line 4 are connected together by the first plug 8a, the third-level interconnect line 17a and the first-level interconnect line 4 are connected together by the second plug 8a. The first and second contact holes 7a and 7b are simultaneously formed in the second interlayer dielectric 5, as opposed to a conventional technique in which (A) a contact hole for providing electrical continuity between the third-level interconnect line and the first-level interconnect line and (B) a contact hole for providing electrical continuity between the second-level interconnect line and the first-level interconnect line are formed at different fabrication steps. In the present embodiment (see FIG. 1(b)), both the first contact hole 7a and the second contact hole 7b are formed by means of a single photoetching process using a single photoresist mask. This not only reduces the number of contact hole formation masks but also allows reduction in the photolithography and etching steps for contact hole formation.

In addition to the above-described advantages, the present invention provides the following advantages. The depth of the second contact hole 7b for connecting the third-level interconnect line 17a and the first-level interconnect line 4 is equal to the depth of the first contact hole 7a for connecting the second-level interconnect line 9a and the first-level interconnect line 4. As previously discussed, in the conventional technique, when trying to provide connection, for example, between third-level wiring and first-level wiring by means of a contact hole, the contact hole inevitably comes to have a great depth since it must pass through two interlayer dielectrics. In addition, with increasing the scale of integration, the diameter of contact holes decreases, therefore increasing the aspect ratio. This may produce connection failures. Conversely, in accordance with the present embodiment, the depth of the second contact hole 7b is the thickness of the second interlayer dielectric 5. As a result, even when very fine contact hole diameters are required for the purpose of achieving a larger scale of integration, there occurs no increase in aspect ratio. For instance, if the contact hole diameter is somewhere between 0.4 and 0.6 μm, the thickness of the second dielectric 5 does not exceed 1.8 μm but is normally held around 800 nm and the aspect ratio is held below 3. Drawbacks, e.g., connection failures caused by plug-forming material deposition failure, can be prevented, therefore providing highly reliable semiconductor devices.

Additionally, the depth of the second contact hole 7b is shallow. This provides the advantage that the positional difference in the lateral direction between the upper end of the hole 7b and the lower end thereof is reduced when forming the hole 7b. Therefore, even when patterns for the first-level interconnect line 4 are fine, connection failures between the third-level interconnect line 17a and the first-level interconnect line 4, caused by the difference, are possibly prevented.

In the present embodiment both the first plug 8a and the second plug 8b extend to the first-level interconnect line 4. Locations of the first-level interconnect line 4 with which the plugs 8a, 8b are connected may be electrically separated from each other. Especially in such a case, at the time of forming the second contact hole 7b, alignment of the second contact hole 7b with the first-level interconnect line 4 must be considered and, in addition, consideration must be given to the prevention of interference of the second contact hole 7b with the plug 8a. If the first and second contact holes are separately formed, short-circuiting may result because of the positional difference between the contact hole formation masks. In the present embodiment, the contact holes 7a and 7b are simultaneously formed using the same photoresist mask and, as a result, no interference is caused by the difference. The third-level interconnect line 17a and the second-level interconnect line 9a are separated by the sidewall 14a in a self-alignment fashion. As described above, in a semiconductor device fabricated in accordance with the present embodiment, isolation/insulation between portions which are not to be electrically connected together is established without fail. As a result, the present embodiment achieves high semiconductor device reliability.

In the first embodiment, the first contact hole 7a is the contact hole for establishing a connection between the first-level interconnect line 4 and the second-level interconnect line 9a. The first contact hole 7a, however, may act as a contact hole for establishing a connection between an impurity-diffused region of the silicon substrate 1 and the second-level interconnect line 9a. Likewise the second contact hole 7b may act as a contact hole for establishing an impurity-diffused region of the silicon substrate 1 and the third-level interconnect line 17a.

In the present embodiment, the first-level interconnect line 4, the second-level interconnect line 9a, and the third-level interconnect line 17a are all made of tungsten. Other materials, i.e., aluminum, molybdenum, and copper, may be used with the same effects as tungsten.

EMBODIMENT 2

Referring now to FIGS. 2(a)–(g), the second embodiment is described.

The fabrication steps shown in FIGS. 2(a)–(g) are basically the same as the fabrication steps shown in FIGS. 1(a)–(g).

Figure 2A:
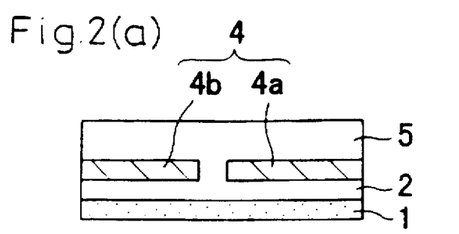
FIGS. 2(a)–(g) depict cross sectional views at different steps of the fabrication of a semiconductor device in accordance with a second embodiment of the present invention.

FIG. 2(a) shows a fabrication step. Unlike the first embodiment, no contact holes 3 for establishing a connection between the first-level interconnect line 4 and the silicon substrate 1 are formed. Instead, the first-level interconnect line 4 is divided into two parts, namely a sub-interconnect line 4a and a sub-interconnect line 4b.

Figure 2B:
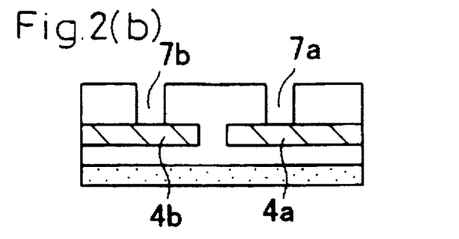
Figure 2C:
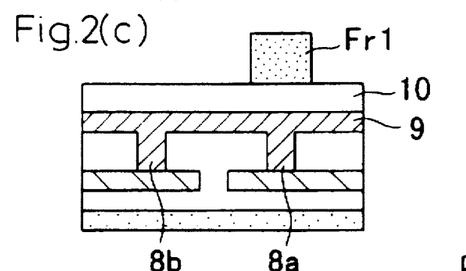
Figure 2D:
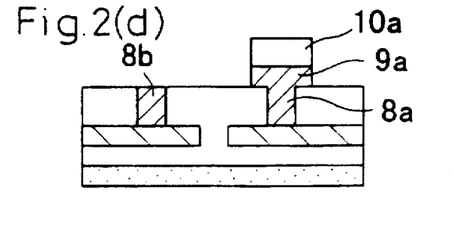
Figure 2E:
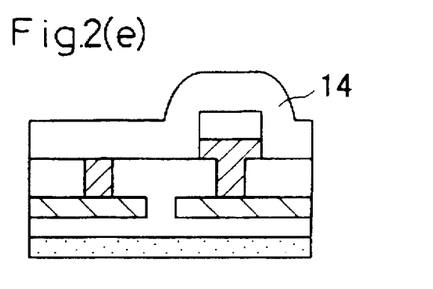
Figure 2F:
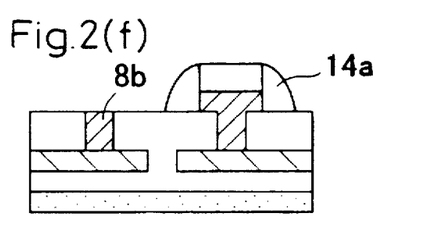

FIG. 2(b) shows a fabrication step in which the first and second contact holes 7a and 7b are formed. Whereas the first contact hole 7a extends down to the sub-interconnect line 4a, the second contact hole 7b extends down to the sub-interconnect line 4b.

The subsequent fabrication step and other fabrication steps are the same as the first embodiment and are not described here.

Figure 2G:
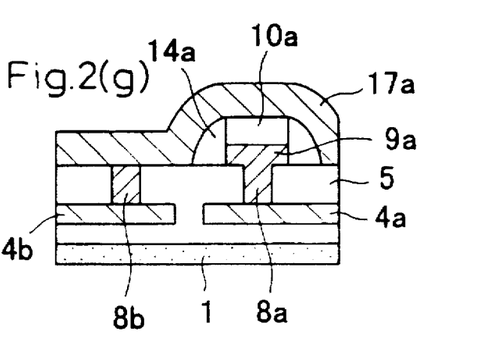

In a semiconductor device fabricated in accordance with the present embodiment, the first plug 8a provides electrical continuity between the second-level interconnect line 9a and the sub-interconnect line 4a. The second plug 8b provides electrical continuity between the third-level interconnect line 17a and the sub-interconnect line 4b. None of the sub-interconnect lines 4a, 4b are associated with any one of impurity-diffused regions of the silicon substrate 1. In view of the layout aspect, such a first-level interconnect line may be required. Even in such a case, the same effect as the first embodiment can be obtained.

In the present embodiment, the first-level interconnect line 4, the second-level interconnect line 9a, the third-level interconnect line 17a, the first plug 8a, and the second plug 8b are all made of tungsten. Other materials, i.e., aluminum, molybdenum, and copper, may be used with the same effects as tungsten.

EMBODIMENT 3

Referring now to FIGS. 3(a)–(j), the third embodiment is illustrated below.

Figures 3A, 3B, 3C, 3G, 3H:
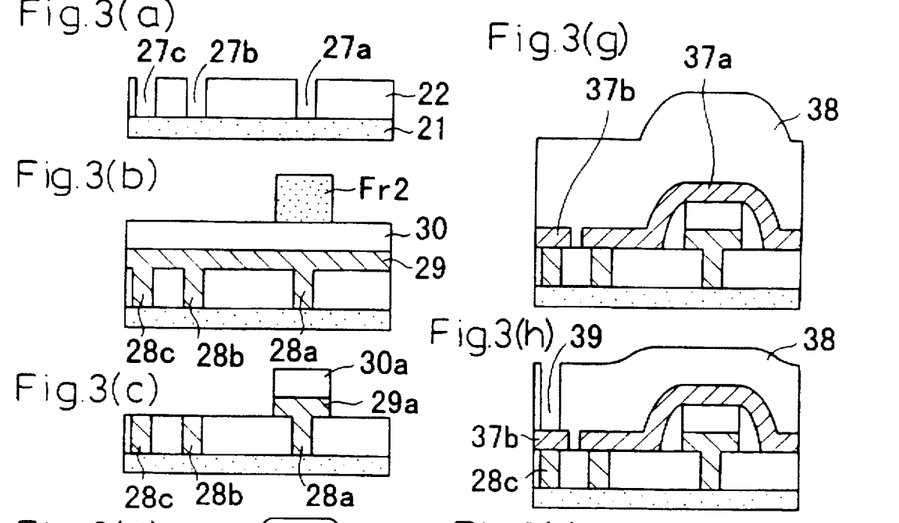
FIGS. 3(a)–(j) depict cross sectional views at different steps of the fabrication of a semiconductor device in accordance with a third embodiment of the present invention.

FIG. 3(a) depicts a fabrication step in which a first interlayer dielectric 22, which is a silicon oxide layer, is formed on a substrate 21 of single crystal silicon. Subsequently a photoresist mask, not shown, is formed on the first interlayer dielectric 22. Three contact holes 27a, 27b, and 27c are simultaneously formed in the first interlayer dielectric 22 by means of a photoetching technique using the photoresist mask. These contact holes 27a–27c extend down to respective impurity-diffused regions (not shown) of the silicon substrate 21. These three impurity-diffused regions are formed at different locations near the surface of the silicon substrate 21 and are electrically insulated from one another. In the present embodiment, the three impurity-diffused regions respectively act as the first, second, and third upper conductive portions formed at the same height level above the silicon substrate 21.

FIG. 3(b) depicts a fabrication step in which tungsten is deposited over the entire surface of the silicon substrate 21 by means of a CVD technique. As a result, the contact holes 27a, 27b, and 27c are all filled with tungsten thereby forming a first, a second, and a third plug 28a, 28b, and 28c, and, at the same time, a tungsten layer 29 acting as the first conducting layer is formed on the plugs 28a, 28b, and 28c and on the first interlayer dielectric 22. This is followed by deposition of a silicon oxide layer 30 on the tungsten layer 29. A photoresist mask Fr2 is formed on the silicon oxide layer 30 in such a position thereof as to mask the first plug 28a and its neighboring areas.

FIG. 3(c) depicts a fabrication step in which the photoresist mask Fr2 is used to pattern the silicon oxide layer 30 and the tungsten layer 29, to form a first-level interconnect line 29a and its top protective layer 30a. At the same time, the tops of the plugs 28b and 28c are exposed while the top of the plug 28a remains unexposed. The first-level interconnect line 29a is a first upper conductive portion which is connected with the first plug 28a.

Figure 3D:
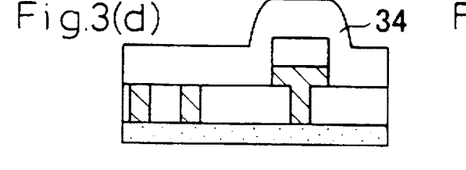

FIG. 3(d) depicts a fabrication step in which a CVD technique is employed to form a silicon oxide layer 34 all over the silicon substrate 21 for sidewall formation.

Figure 3E:
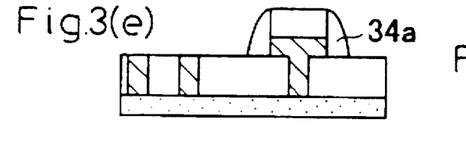

FIG. 3(e) depicts a fabrication step in which the silicon oxide layer 34 is etched back by means of an anisotropic etching technique, whereupon the tops of the plugs 28b and 28c are re-exposed. At the same time, a sidewall 34a is formed to cover both the side surface of the first-level interconnect line 29a and the side surface of the top protective layer 30a.

Figure 3F:
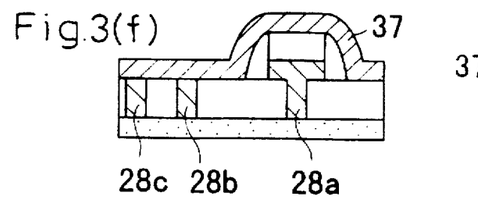

FIG. 3(f) depicts a fabrication step in which a tungsten layer 37, i.e., a second conducting layer, is deposited all over the silicon substrate 21 by means of a CVD technique.

FIG. 3(g) depicts a fabrication step in which the tungsten layer 37 is first patterned by means of a photoetching technique, to form a third-level interconnect line 37a and an intermediate interconnect line 37b. The third-level interconnect line 37a becomes a second upper conductive portion which is connected with the second plug 28b. The intermediate interconnect line 37b is an intermediate conductive portion which is connected with the third plug 28c. Subsequently, a second interlayer dielectric 38, which is a silicon oxide layer (i.e., a BPSG layer doped with boron and phosphorus), is formed over the entire surface of the silicon substrate 21.

FIG. 3(h) depicts a fabrication step in which the second interlayer dielectric 38 is made to reflow to be planarized. Thereafter, a fourth contact hole 39 is formed in the second interlayer dielectric 38. This fourth contact hole 39 extends down to the intermediate interconnect line 37b above the third plug 28c.

Figure 3I:
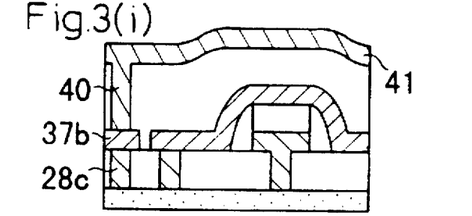

FIG. 3(i) depicts a fabrication step in which tungsten is deposited all over the silicon substrate 21. As a result, the fourth contact hole 39 is filled with tungsten to form a fourth plug 40. At the same time, a tungsten layer 41, which is a third conducting layer, is formed on the second interlayer dielectric 38.

Figure 3J:
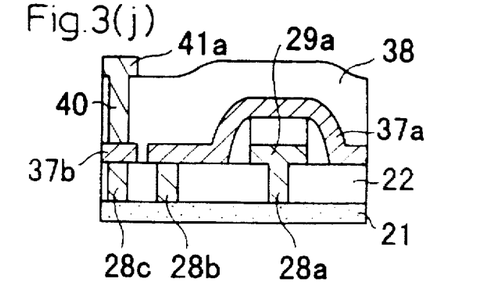

FIG. 3(j) depicts a fabrication step in which the tungsten layer 41 is subjected to a patterning process to form a third-level interconnect line 41a. This third-level interconnect line 41a is connected with the impurity-diffused region of the silicon substrate 21 (i.e., the third lower conductive portion) via the fourth plug 40, the intermediate interconnect line 37b, and the third plug 28c.

In the present embodiment, (A) the first contact hole 27a for establishing a connection between the first-level interconnect line 29a (i.e., the first upper conductive portion) and the impurity-diffused region (i.e., the first lower conductive portion) of the silicon substrate 21 and (B) the second contact hole 27b for establishing a connection between the second-level interconnect line 37a (i.e., the second upper conductive portion) and the impurity-diffused region (i.e., the second lower conductive portion) of the silicon substrate 21, are simultaneously formed by means of a single photoetching process using a single mask. Such arrangement not only reduces the number of contact hole formation masks, it also cuts down the number of photoetching process steps.

In the present embodiment, the intermediate interconnect line 37b, which is connected with the third plug 28c, is formed in the same interconnect layer as the second-level interconnect line 37a is formed. The third-level interconnect line 41a (i.e., the third upper conductive portion) and the impurity-diffused region (i.e., the third lower conductive portion) of the silicon substrate 21 are connected together by the intermediate interconnect line 37b and the fourth plug 40. In other words, the contact hole for establishing a connection between the third-level interconnect line 41a and the impurity-diffused region of the silicon substrate 21, is made up of the third contact hole 27c and the fourth contact hole 39 which are separately formed. Such arrangement prevents the increase in aspect ratio caused by forming, at the same time, a hole passing through the first and second interlayer dielectrics 22 and 38. Connection failures due to deposition failure of, for example, tungsten can be prevented. Even for the case of semiconductor devices with a multilevel interconnect structure, it is possible to achieve high semiconductor device reliability.

In the third embodiment, the intermediate interconnect line 37b may be formed at the same time that the first-level interconnect line 29a is formed. In such a case, although the top protective layer and the sidewall are formed simultaneously, they are covered with the second interlayer dielectric 38. This is basically the same as the fabrication step of the present embodiment.

In the present embodiment, the interconnect lines 29a, 37a, 37b, and 41a and the plugs 28a, 28b, and 28c are all formed of tungsten, but they may be formed of either aluminum, molybdenum, or copper.

EMBODIMENT 4

Referring now to FIGS. 4(a)–(j), the fourth embodiment is described below.

As in the third embodiment, three impurity-diffused regions, i.e., a first, a second, and a third lower conductive portion, are formed in the silicon substrate 21. FIGS. 4(a)–(e) depict the same fabrication steps as FIGS. 3(a)–(e).

Figure 4A:
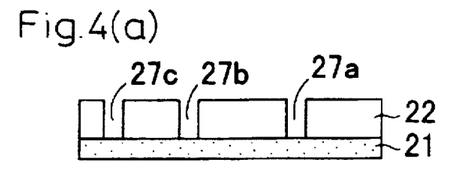
FIGS. 4(a)–(j) depict cross sectional views at different steps of the fabrication of a semiconductor device in accordance with a fourth embodiment of the present invention.
Figures 4B, 4C:
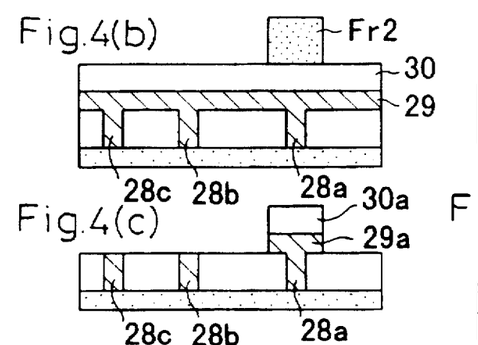
Figure 4D:
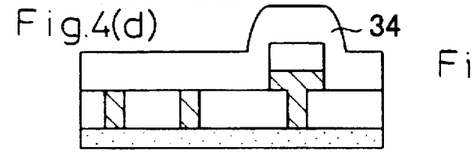
Figure 4E:
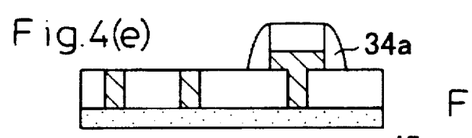
Figure 4F:
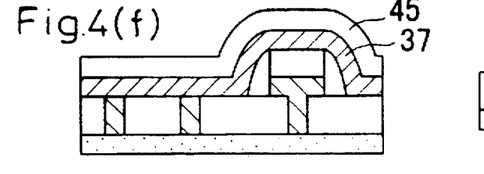

FIG. 4(f) depicts a fabrication step in which the tungsten layer 37 and the silicon oxide layer 45 are formed over the entire surface of the silicon substrate 21.

Figure 4G:
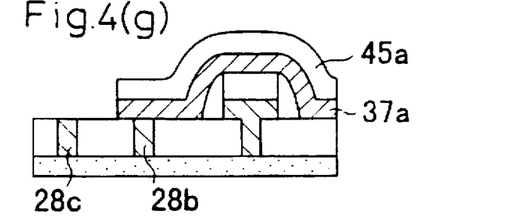

FIG. 4(g) depicts a fabrication step in which both the tungsten layer 37 and the silicon oxide layer 45 are patterned to form the second-level interconnect line 37a and the top protective layer 45a. The second-level interconnect line 37a is connected to the second plug 28b. At the same time, the top of the third plug 28c is exposed.

Figure 4H:
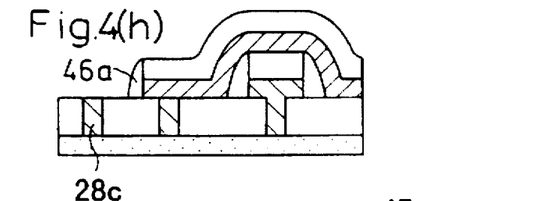

FIG. 4(h) depicts a fabrication step in which a silicon oxide layer (not shown) is formed all over the silicon substrate 21 for sidewall formation. This silicon oxide layer is etched back to form the sidewall 46a to cover both the side surface of the second-level interconnect line 37a and the side surface of the top protective layer 45a. At this time, the top of the third plug 28c still remains exposed.

Figure 4I:
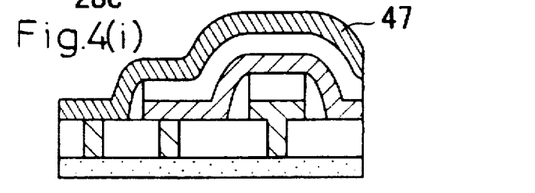
Figure 4J:
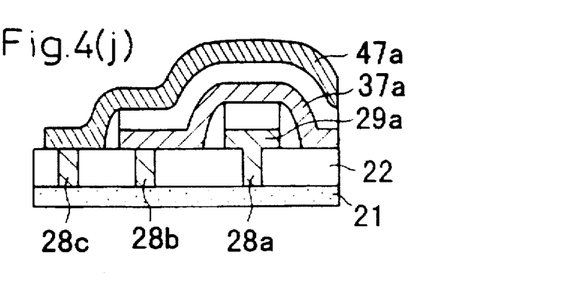

FIG. 4(i) depicts a fabrication step in which the tungsten layer 47 is formed all over the silicon substrate 21. FIG. 4(j) depicts a fabrication step in which the tungsten layer 47 is patterned to form the third-level interconnect line 47a that is connected with the third plug 28c.

In comparison with the third embodiment, the present embodiment requires a less number of fabrication steps, in other words the fabrication step of forming the fourth contact hole 39 is no longer necessary. Additionally, the present embodiment not only reduces the number of contact hole formation masks, it also cuts down the number of photoetching process steps.

Finally, the third-level interconnect line 47a (i.e., the third upper conductive portion) and the impurity-diffused region (i.e., the third lower conductive portion) are connected together, via the third plug 28c only, therefore achieving high semiconductor device reliability.

EMBODIMENT 5

Referring now to FIGS. 5(a)–(g), the fifth embodiment is illustrated.

FIGS. 5(a)–(g) show cross sectional views for Rmem (the dynamic RAM's memory cell region) and Rper (the dynamic RAM's peripheral circuit region).

Figures 5A, 5B:
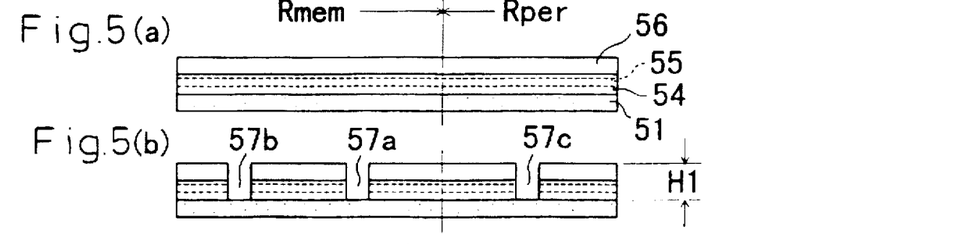
FIGS. 5(a)–(g) depict cross sectional views at different steps of the fabrication of a semiconductor device in accordance with a fifth embodiment of the present invention.

FIG. 5(a) depicts a fabrication step. A word line 55 is formed over a silicon substrate 51 with a 10-nm gate oxide layer sandwiched therebetween. The word line 55 is an n-type impurity-containing polysilicon layer having a thickness of about 250 nm. A single word line 55 extends over great numbers of active regions and isolators for isolation between components of the active regions and acts in the active region as a gate electrode on the gate insulating layer. Formed above each gate electrode is a top protective layer. Each gate electrode has at its side surface a sidewall and an isolator/insulating layer. In FIG. 5(a), all of these insulating layers are shown as a silicon oxide layer 54. Although not shown in FIG. 5(a), MOS transistors, each of which is made up of a gate electrode and impurity-diffused regions, i.e., source/drain regions formed in the silicon substrate, are formed. A first interlayer dielectric 56, which is a CVD silicon oxide layer, is formed on the silicon oxide layer 54, having a thickness of about 500 nm.

FIG. 5(b) shows a fabrication step in which a first, a second, and a third contact hole 57a, 57b, and 57c are simultaneously formed by means of a photoetching technique using a photoresist mask. The first and second contact holes 57a and 57b are formed such that they pass through both the first interlayer dielectric 56 and the silicon oxide layer 54. The first contact hole 57a extends down to an impurity-diffused region, i.e., a first lower conductive portion in the memory cell region Rmem of the silicon substrate 51. The second contact hole 57b extends down to another impurity-diffused region, i.e., a second lower conductive portion in Rmem of the silicon substrate 51. The first and second contact holes 57a and 57b each have a diameter of about 0.3 μm or about 0.4 μm. At the same time of the formation of the first and second contact holes 57a and 57b, the third contact hole 57c is formed such that it passes through both the first interlayer dielectric 56 and the silicon oxide layer 54. The third contact hole 57c extends down to an impurity-diffused region, i.e., a third lower conductive portion in the peripheral circuit region Rper of the silicon substrate 51. The third contact hole 57c has a diameter of about 0.3 μm or about 0.4 μm.

Figure 5C:
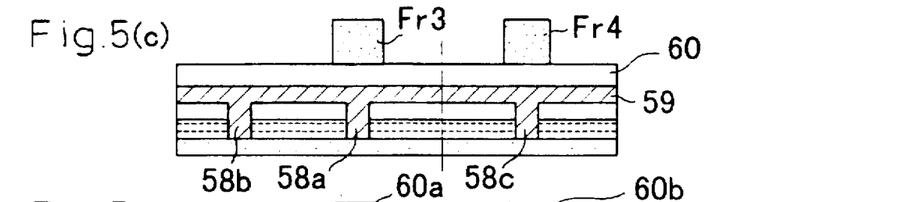

FIG. 5(c) depicts a fabrication step in which n-type impurity-containing polysilicon and tungsten silicide are deposited in the contact holes 57a–57c and on the first interlayer dielectric 56, whereupon a first, a second, a third plug 58a–58c are formed in the contact holes 57a–57c, respectively. At the same time, a lamination layer 59 (i.e., a first conducting layer) is formed on the first interlayer dielectric 56, having a thickness of between about 200 nm and about 300 nm. This is followed by formation of a silicon oxide layer 60 having a thickness of between about 300 nm and about 400 nm on the lamination layer 59. Thereafter, a photoresist mask Fr3 is formed on the silicon oxide layer 60 in such a position thereof as to mask the first contact hole 57a and its surrounding areas, while on the other hand a photoresist mask Fr4 is formed on the silicon oxide layer 60 in such a position thereof as to mask the third contact hole 57c and its surrounding areas.

Figures 5D, 5E:
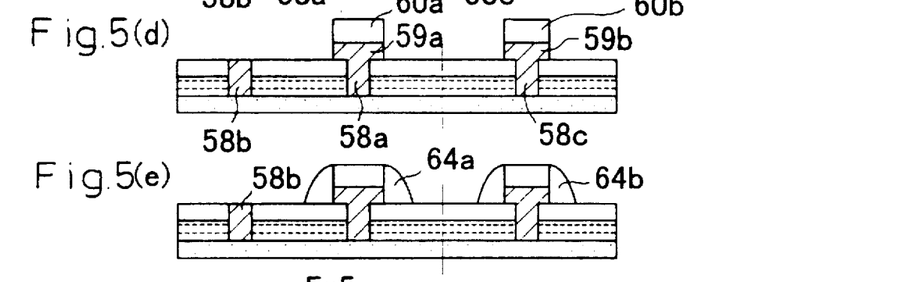

FIG. 5(d) depicts a fabrication step. The silicon oxide layer 60 and the lamination layer 59 are patterned by means of a photoetching technique using the masks Fr3 and Fr4, to form a bit line 59a, a top protective layer 60a, a bit line 59b, and a top protective layer 60b. The bit line 59a is a first upper conductive portion that is associated with the first plug 58a in the region Rmem. The bit line 59b is associated with the third plug 58c in the region Rper. At this time, the lamination layer 59 above the plug 58b and its neighboring areas is removed in such a way as to expose the top of the second plug 58b.

FIG. 5(e) depicts a fabrication step in which a silicon oxide layer is formed over the entire surface of the silicon substrate. This silicon oxide layer is etched back such that a sidewall 64a is formed to cover both the side surface of the bit line 59a and the side surface of the top protective layer 60a and a sidewall 64b is formed to cover both the side surface of the bit line 59b and the side surface of the top protective layer 60b.

Figure 5F:
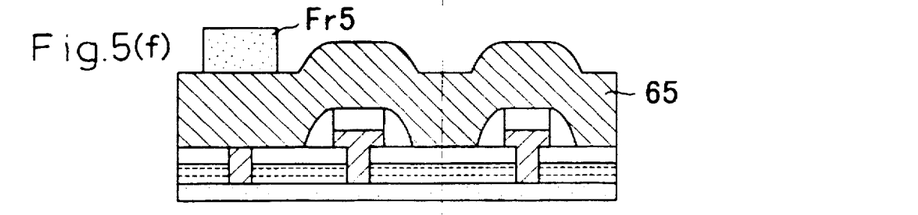

FIG. 5(f) depicts a fabrication step. A layer 65 of tungsten silicide is formed over the entire surface of the silicon substrate. Thereafter, a photoresist mask Fr5 is formed on the tungsten silicide layer 65 in such a position thereof as to mask the second plug 58 and its neighboring areas.

Figure 5G:
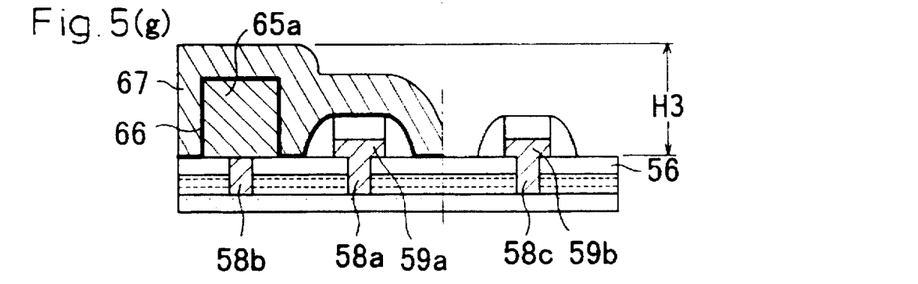

FIG. 5(g) depicts a fabrication step in which the tungsten silicide layer 65 is patterned by making use of the mask Fr5, to form a charge-storage electrode 65a having a thickness of between about 500 nm and about 600 nm. This electrode 65a is connected with the second plug 58b. Thereafter, a capacity insulator 66, made up of a silicon nitride layer and a silicon oxide layer, is formed. This is followed by formation of a plate electrode 67 composed of an n-type impurity-containing polysilicon layer having a thickness of between about 100 nm and about 200 nm.

The subsequent fabrication steps are not described in detail. An upper-level interconnect line or the like is formed over a third interlayer dielectric or the like.

In accordance with the present embodiment, the first contact hole 57a for establishing connection between the bit line 59a and the first impurity-diffused region of the silicon substrate 51, the third contact hole 57c for establishing connection between the bit line 59b and the second impurity-diffused region of the silicon substrate 51, and the second contact hole 57b for establishing connection between the charge-storage electrode 65a and the third impurity-diffused region of the silicon substrate 51, are all formed at the same time by means of a photoetching technique using a photoresist mask. Such arrangement not only reduces the number of contact hole formation masks, it also cuts down the number of photoetching process steps.

The present embodiment produces the following advantages over the conventional fabrication method as shown in FIGS. 6(a)–(h).

Firstly, in the prior art fabrication technique, the second contact hole 107b for establishing connection between the charge-storage electrode 112a and the impurity-diffused region of the silicon substrate 101 has a depth of H2 (about 2 μm) where H2 is a sum of the thickness of the silicon oxide layer 104, the thickness of the first interlayer dielectric 106, and the thickness of the second interlayer dielectric 110. Conversely, in the present embodiment, the second contact hole 57b has a depth of H1 (about 1.5–1.6 μm) where H1 is a sum of the thickness of the silicon oxide layer 54 and the thickness of the first interlayer dielectric 56. To sum up, the depth of the second contact hole 57b is reduced by the thickness of the second interlayer dielectric 110 of FIG. 6(e). The aspect ratio of the second contact hole 57b is reduced. Connection failures can be prevented effectively thereby achieving highly reliable semiconductor devices.

Figure 8B:
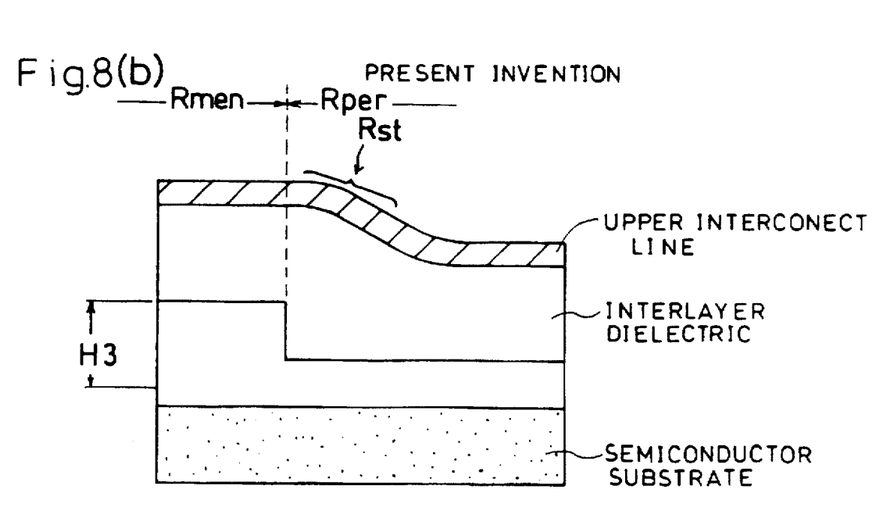

Secondly, as shown in FIG. 5(g), the absolute surface level difference H3 (i.e., the difference in height between the top of the plate electrode 114 in the memory cell region Rmem and the bottom of the bit line 59 in the peripheral circuit region Rper) becomes lower than the absolute surface level difference H4 in the conventional dynamic RAM of FIG. 6(h). This is because of the fact that in the present embodiment the lower end of the charge-storage electrode 65a and the lower end of the bit line 59 are placed at the same height (on the first interlayer dielectric 56). FIGS. 8(a) and 8(b) are diagrams for comparison between a conventional dynamic RAM having the absolute surface level difference H4 and a dynamic RAM of the present embodiment having the absolute surface difference H3. In the conventional dynamic RAM, on the one hand, the region Rst is steep, as a result of which upper interconnection lines are likely to cut off. In the present dynamic RAM, on the other hand, the region Rst becomes less steep, as a result of which the probability that upper interconnect lines cut off is extremely reduced. In other words, it is possible to improve reliability. Additionally, even if the charge-storage electrode 65a becomes greater in thickness, the increase in level difference over the entire semiconductor substrate is suppressed, thereby achieving greater design latitude, in other words the degree of latitude of modifying the shape of the charge-storage electrode 65a according to the type of semiconductor device and the structure of semiconductor device becomes greater.

OTHER EMBODIMENTS

In the fifth embodiment, the word line 55 is constructed using an n-type impurity-containing polysilicon layer. The word line 55 may be constructed by a single-level layer of either molybdenum, tungsten, titanium, platinum, molybdenum silicide, titanium silicide, or platinum silicide, or by a lamination such as a lamination of a molybdenum silicide layer, a titanium suicide layer or a platinum silicide layer, and an n-type impurity-containing polysilicon layer.

Each plug 58a–58c as well as each bit line 59a and 59b is formed of a lamination of a polysilicon layer and a tungsten silicide layer. Either a single-level layer such as an n-type impurity-containing polysilicon layer, a tungsten layer, a molybdenum layer, a titanium layer, a platinum layer, a molybdenum silicide layer, a titanium silicide layer, and a platinum silicide layer, or a lamination such as a lamination of a molybdenum silicide layer, a titanium silicide layer, a titanium silicide layer or a platinum silicide layer, and an n-type impurity-containing polysilicon layer may be used.

The charge-storage electrode 65a is formed of a tungsten silicide layer. Either a single-level layer such as an n-type impurity-containing polysilicon layer, a titanium silicide layer, a molybdenum silicide layer, and a tungsten layer, or a lamination such as a lamination of an n-type impurity-containing polysilicon layer, a platinum layer, and a tantalum layer may be used to form the electrode 65a.

The capacity insulator 66 is formed of a lamination of a silicon nitride layer and a silicon oxide layer. Either a single-level layer such as a tantalum oxide layer, a strontium titanate layer, a barium-added strontium titanate layer, a PZT layer (i.e., a lead/zirconium/titanium-containing oxide layer), a PLZT layer (i.e. a lead/lanthanum/zirconium/titanium-containing oxide layer), or a lamination such as a lamination of a tantalum oxide layer and a silicon oxide layer may be used to construct the capacity insulator 66.

The plate electrode 67 is formed of an n-type impurity-containing polysilicon layer. Either a titanium nitride layer, a tungsten layer, a tungsten silicide layer, a molybdenum layer, or a molybdenum silicide layer may be used to form the plate electrode 67.

The first lower conductive portion and the second lower conductive portion may not be always placed the same height. For example, suppose that the first lower conductive portion is a MOS transistor gate electrode and the second lower conductive portion is a MOS transistor source/drain extraction electrode. Even such a case achieves the same effects that each embodiment of the present invention does. In this case, the gate electrode (the first lower conductive portion) is connected with no impurity-diffused regions of the silicon substrate while the extraction electrode (the second lower conductive portion) is connected with an impurity-diffused region of the silicon substrate. Even in such a case, the present invention can be realized.

The invention claimed is:

1. A method of fabricating a semiconductor device on a substrate of semiconductor material, said method comprising:

(1) a first step of forming on said semiconductor substrate a first lower conductive portion, a second lower conductive portion and a third lower conductive portion;

(2) a second step of forming a first insulating layer to cover said firsts second and third lower conductive portions;

(3) a third step of forming a first connection hole, a second connection hole and a third connection hole in said first insulating layer, wherein said first connection hole extends down to said first lower conductive portion;

wherein said second connection hole extends down to said second lower conductive portion and wherein said third connection hole extends down to said third lower conductive portion;

(4) a fourth step of depositing a conductive material in said first, second and third connection holes to form a first buried layer, a second buried layer and a third buried layer, respectively;

(5) a fifth step of:

(5-1) forming a first conducting layer to cover said first buried layer, said second buried layer, and said first insulating layer, and forming a second insulating layer to cover said first conducting layer;

(5-2) patterning said first conducting layer and said second insulating layer to form a first upper conductive portion and a top protective layer, wherein said first upper conductive portion belongs to an interconnect layer located above each said lower conductive portion and is connected with said first buried layer; and (5-3) exposing the top of said second buried layer;

(6) a sixth step of forming a sidewall on the side surfaces of said first upper conductive portion and said top protective layer;

(7) a seventh step of:

(7-1) forming a second conducting layer to cover said first insulating layer, said sidewall, said top protective layer, and said second buried layer; and (7-2) patterning said second conducting layer to form a second upper conductive portion, wherein said second upper conductive portion belongs to an interconnect layer located above said first upper conductive portion and is connected with said second buried layer;

(8) an eighth step of forming an interlayer dielectric over the entire surface of said semiconductor substrate;

(9) a ninth step of planarizing said interlayer dielectric;

(10) a tenth step of forming in said interlayer dielectric a fourth connection hole which extends down to said intermediate conductive portion;

(11) an eleventh step of depositing a conductive material in said fourth connection hole to form a fourth buried layer; and (12) a twelfth step of:
   (12-1) forming a third conducting layer to cover said fourth buried layer and said interlayer dielectric; and
   (12-2) patterning said third conducting layer to form a third upper conductive portion, wherein said third upper conductive portion belongs to an interconnect layer located above said second upper conductive portion and is connected with said fourth buried layer,
   wherein, either one of said fifth step and said seventh step includes forming an intermediate conductive portion that is connected to said third buried layer.

2. A method according to claim 1,
   wherein in said first step all said first lower conductive portion, said second lower conductive portion and said third lower conductive portion are formed in an interconnect layer which is connected with said semiconductor substrate.

3. A method according to claim 1,
   wherein in said first step all said first lower conductive portion, said second lower conductive portion and said third lower conductive portion are formed in an interconnect layer that is electrically isolated from said semiconductor substrate.

4. A method according to claim 1,
   said first step including forming a first impurity-diffused region, a second impurity-diffused region and a third impurity-diffused region in said semiconductor substrate;
   said first impurity-diffused region acting as said first lower conductive portion;
   said second impurity-diffused region acting as said second lower conductive portion; and
   said third impurity-diffused region acting as said third lower conductive portion.

5. A method according to claim 1,
   wherein said third step is performed such that each of said first, second and third connection holes is formed having a diameter of 0.6 µm or less and an aspect ratio of 3 or less.

6. A method of fabricating on a substrate of semiconductor material a semiconductor device acting as a dynamic RAM, said method comprising:
   (1) a first step of, in said semiconductor substrate, forming within the memory cell region of said dynamic RAM a transistor composed of a gate electrode, a first impurity-diffused region and a second impurity-diffused region, and forming a third impurity-diffused region in the peripheral circuit region of said dynamic RAM;
   (2) a second step of forming a first insulating layer to cover said semiconductor substrate and said gate electrode;
   (3) a third step of forming in said insulating layer a first connection hole, a second connection hole and a third connection hole;
   said first connection hole extending down to said first impurity-diffused region;
   said second connection hole extending down to said second impurity-diffused region; and
   said third connection hole extending down to said third impurity-diffused region;
   (4) a fourth step of depositing a conductive material in said first, second and third connection holes to form a first buried layer, a second buried layer and a third buried layer, respectively;
   (5) a fifth step of:
      (5-1) forming a first conducting layer to cover said insulating layer and said first and second buried layers, and forming a second insulating layer to cover said first conducting layer; and
      (5-2) patterning said first conducting layer and said second insulating layer to form a bit line that is connected with said third buried layer and a bit line top protective layer, and exposing the top of said second buried layer,
   wherein said bit line is connected with said first buried layer;
   (6) a sixth step of forming a sidewall at the side surfaces of said bit line and said top protective layer;
   (7) a seventh step of:
      (7-1) forming a second conducting layer to cover said first insulating layer, said sidewall, said top protective layer, and said second buried layer; and
      (7-2) patterning said second conducting layer to form a charge-storage electrode which is connected to said second buried layer; and
   (8) an eighth step of:
      (8-1) forming a second insulating layer to cover said charge-storage electrode, said first insulating layer, said sidewall, and said top protective layer, and forming a third conducting layer to cover said second insulating layer; and
      (8-2) patterning said second insulating layer and said third conducting layer to form a capacity insulator and a plate electrode.

7. A method according to claim 6,
   wherein said third step is performed such that each of said first and second connection holes is formed having a diameter of 0.6 µm or less and an aspect ratio of 3 or less.

* * * * *